United States Patent
Kabe et al.

(10) Patent No.: US 8,372,761 B2
(45) Date of Patent: *Feb. 12, 2013

(54) PLASMA OXIDATION PROCESSING METHOD, PLASMA PROCESSING APPARATUS AND STORAGE MEDIUM

(75) Inventors: Yoshiro Kabe, Amagasaki (JP); Takashi Kobayashi, Amagasaki (JP); Toshihiko Shiozawa, Amagasaki (JP); Junichi Kitagawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 409 days.

This patent is subject to a terminal disclaimer.

(21) Appl. No.: 12/594,078

(22) PCT Filed: Mar. 28, 2008

(86) PCT No.: PCT/JP2008/056134
§ 371 (c)(1),
(2), (4) Date: Sep. 30, 2009

(87) PCT Pub. No.: WO2008/123431
PCT Pub. Date: Oct. 16, 2008

(65) Prior Publication Data
US 2010/0136797 A1    Jun. 3, 2010

(30) Foreign Application Priority Data

Mar. 30, 2007 (JP) ................. 2007-091700

(51) Int. Cl.
*H01L 21/31* (2006.01)
(52) U.S. Cl. ........ 438/770; 438/435; 438/437; 438/771; 257/E21.301
(58) Field of Classification Search .......... 438/788, 438/435, 437, 770, 771; 257/E21.301
See application file for complete search history.

(56) References Cited

U.S. PATENT DOCUMENTS

| | | | |
|---|---|---|---|
| 6,368,941 B1 * | 4/2002 | Chen et al. | 438/424 |
| 7,910,495 B2 * | 3/2011 | Shiozawa et al. | 438/772 |
| 2005/0250338 A1 | 11/2005 | Ohmi et al. | |
| 2006/0156984 A1 * | 7/2006 | Nozawa et al. | 118/723 R |
| 2006/0219659 A1 | 10/2006 | Yamauchi | |

FOREIGN PATENT DOCUMENTS

| | | |
|---|---|---|
| JP | 2001-156059 | 6/2001 |
| JP | 2001-160555 | 6/2001 |
| JP | 2005-294551 | 10/2005 |
| JP | 2006-286662 | 10/2006 |
| WO | 01/69673 | 9/2001 |
| WO | 2004/008519 | 1/2004 |
| WO | 2004/049423 | 6/2004 |

OTHER PUBLICATIONS

International Search Report mailed on Jun. 10, 2008 for International Application No. PCT/JP2008/056134.
Chinese Office Action issued on Jan. 17, 2011 for Chinese Application No. 200880011183.X w/ English translation.

* cited by examiner

*Primary Examiner* — Zandra Smith
*Assistant Examiner* — Toniae Thomas
(74) *Attorney, Agent, or Firm* — Smith, Gambrell & Russell, LLP

(57) ABSTRACT

A silicon oxide film is formed in a processing chamber of a plasma processing apparatus by performing oxidation process, by using plasma to a processing object having a patterned irregularity, wherein the plasma is generated while high-frequency power is supplied to a mount table under the conditions that the oxygen content in a process gas is not less than 0.5% and less than 10% and the process pressure is 1.3 to 665 Pa.

13 Claims, 8 Drawing Sheets

PLASMA OXIDATION PROCESSING METHOD, PLASMA PROCESSING APPARATUS AND STORAGE MEDIUM

TECHNICAL FIELD

The present invention relates to a plasma oxidation processing method, and more particularly to a plasma oxidation processing method which can be applied, for example, in the formation of an oxide film in trenches in shallow trench isolation (STI), a device isolation technique in a semiconductor device manufacturing process.

BACKGROUND ART

STI is known as a technique for electrically isolating a device formed on a silicon substrate. An STI process involves etching silicon e.g. with a silicon nitride film as a mask to form trenches, filling an insulating film of e.g. $SiO_2$ into the trenches, and flattening the surface with the mask (silicon nitride film) as a stopper by chemical mechanical polishing (CMP).

When forming trenches in STI, shoulder portions of the trenches (upper corners in the side walls of the grooves) or the corners of the trenches (the corners in the bottoms of the grooves) sometimes take the form of an acute angle. Consequently, a semiconductor device, such as a transistor, is subject to stress concentration in such portions, resulting in the production of defects. The defects may cause an increase in leakage current and an increase in power consumption. Therefore, it is known to form an oxide film on the interior walls of trenches after forming the trenches by etching, thereby rounding off the shape of the trenches.

Thermal oxidation processing using an oxidation furnace or an RTP (rapid thermal process) apparatus is known as a method for forming such a silicon oxide film. For example, in wet oxidation processing, one of thermal oxidation processing methods, which employs an oxidation furnace, a silicon substrate is heated to a temperature exceeding 800° C. and, using a WVG (water vapor generator) apparatus that generates water vapor by the combustion of oxygen and hydrogen, the heated silicon substrate is exposed to an oxidizing atmosphere of water vapor ($H_2O$), thereby oxidizing the silicon surface and forming a silicon oxide film.

Thermal oxidation processing is considered a method capable of forming a good-quality silicon oxide film. Because of the necessity of processing at a high temperature exceeding 800° C., however, the processing method entails the drawbacks of increased thermal budget, distortion of a silicon substrate due to thermal stress, etc.

On the other hand, as a technique which uses a processing temperature around 400° C. and can therefore avoid the drawbacks of increased thermal budget, distortion of a substrate, etc., an oxide film forming method has been proposed which can easily control the thickness of a film and can form a good-quality silicon oxide film by allowing a processing gas to act on the surface of an electronic device, mainly composed of silicon, to carry out oxidation processing using as the processing gas a mixed gas containing argon gas and oxygen gas at an oxygen flow rate ratio of about 1% and using a microwave-excited plasma formed at a pressure of 133.3 Pa in a chamber (e.g. WO2001/69673, WO2004/008519).

This technique, by carrying out plasma processing under the conditions of a processing pressure on the order of 133.3 Pa and an $O_2$ flow rate ratio of 1% in the processing gas (herein referred to as "low-pressure, low-oxygen concentration conditions" for the sake of simplicity), can achieve high oxidation rate and, in addition, has the advantage that when oxidizing a silicon surface having irregularities, a round shape can be introduced into the top corners of the raised portions of silicon, whereby leakage current from the corner portions due to electric field concentration can be suppressed.

However, when a processing object, having a density distribution in a pattern of grooves or a line/space pattern, formed in the surface of the processing object, is subjected to plasma oxidation processing under the above low-pressure, low-oxygen concentration conditions, a difference in the rate of forming a silicon oxide film will be produced between a nondensely-patterned area and a densely-patterned area, making it impossible to form a silicon oxide film with a uniform thickness. A silicon oxide film whose thickness varies depending on such areas, when used as an insulating film of a semiconductor device, will lower the reliability of the semiconductor device.

As semiconductor devices are becoming increasingly miniaturized, it is desirable to enhance the selectivity of the thickness of an oxide film formed on the bottoms of trenches over that of the film formed on the side walls of the trenches so as to make the oxide film formed on the side walls of the trenches thinner.

DISCLOSURE OF THE INVENTION

It is an object of the present invention to provide a plasma oxidation processing method which, besides forming a round shape at upper corners in the raised portions of a patterned silicon, can form a silicon oxide film having a uniform thickness without producing a difference in the film thickness due to a density difference in the pattern.

It is another object of the present invention to provide a plasma oxidation processing method which additionally can enhance the selectivity of the thickness of a silicon oxide film formed on the bottoms of a pattern over that of the film formed on the side walls of the pattern, thereby making the oxide film thinner on the side walls of the pattern.

According to a first aspect of the present invention, there is provided a plasma oxidation processing method for forming a silicon oxide film by subjecting a processing object having a three-dimensional pattern to oxidation processing with a plasma, said method comprising: setting a processing object having a patterned irregularity on a mounting table provided in a processing chamber of a plasma processing apparatus; supplying a processing gas, containing oxygen in an amount of not less than 0.5% and less than 10%, into the processing chamber and keeping the pressure in the chamber at 1.3 to 665 Pa; and forming a plasma of the processing gas while applying a high-frequency power to the mounting table, thereby carrying out oxidation processing of the processing object with the plasma.

In the first aspect, the oxygen content in the processing gas is preferably 0.5 to 5%, more preferably 0.5 to 2.5%. The processing pressure is preferably 1.3 to 266.6 Pa, more preferably 1.3 to 133.3 Pa.

The output of the high-frequency power per unit area of the processing object may be 0.015 to 5 $W/cm^2$, preferably 0.05 to 1 $W/cm^2$. The output of the high-frequency power may be 5 to 3600 W. The frequency of the high-frequency power may be 300 kHz to 60 MHz, preferably 400 kHz to 27 MHz.

Further in the first aspect, the processing gas may contain hydrogen in an amount of 0.1 to 10%. The processing temperature may be 200 to 800° C.

Preferably, the patterned irregularity is formed at least in a silicon portion. For example, the patterned irregularity is formed in a silicon portion and in an insulating film portion, and at least recessed portions are formed in the silicon portion.

The plasma of the processing gas may be a microwave-excited plasma formed by means of microwaves introduced into the processing chamber from a plane antenna having a plurality of slots.

According to a second aspect of the present invention, there is provided a plasma oxidation processing apparatus comprising: an evacuable processing chamber for carrying out plasma processing of a processing object; a mounting table, disposed in the processing chamber, for placing the processing object thereon; a gas supply mechanism for supplying a processing gas into the processing chamber; a plasma generation mechanism for generating a plasma of the processing gas in the chamber; and a control section for controlling the apparatus in such a manner that the oxygen content in the processing gas is made not less than 0.5% and less than 10% and the pressure in the chamber is kept at 1.3 to 665 Pa, and that the plasma of the processing gas is formed while applying a high-frequency power to the mounting table so that oxidation processing of the processing object with the plasma is carried out.

According to a third aspect of the present invention, there is provided a storage medium which operates on a computer and in which a program for controlling a plasma processing apparatus is stored, said program, upon its execution, causing the computer to control the plasma processing apparatus such that it carries out a plasma oxidation processing method comprising: setting a processing object having a patterned irregularity on a mounting table provided in a processing chamber of the plasma processing apparatus; supplying a processing gas, containing oxygen in an amount of not less than 0.5% and less than 10%, into the processing chamber and keeping the pressure in the chamber at 1.3 to 665 Pa; and forming a plasma of the processing gas while applying a high-frequency power to the mounting table, thereby carrying out oxidation processing of the processing object with the plasma.

According to the present invention, when carrying out oxidation processing of a processing object having a patterned irregularity with a plasma to oxidize the exposed surface having the patterned irregularity and to thereby form a silicon oxide film, the plasma is formed under the conditions of: the oxygen content in the processing gas of not less than 0.5% and less than 10%; and the processing pressure of 1.3 to 665 Pa, while applying a high-frequency power to the mounting table on which the processing object is placed. This makes it possible to form a silicon oxide film having a uniform thickness, without producing a difference in the film thickness due to a density difference in the pattern, while well rounding off upper corner portions in the raised portions of the pattern. Further, the application of a high-frequency power to the mounting table can enhance the selectivity of the thickness of the silicon oxide film formed on the bottoms of the recessed portions of the pattern over that of the film formed on the side walls of the recessed portions and thus can make the silicon oxide film thinner on the side walls of the recessed portions. This suits the progress toward finer devices. The application of a high-frequency power to the mounting table also has the effect of enhancing the roundness of upper corner portions in the raised portions of the pattern. Thus, the roundness of the upper corner portions in the raised portions can be enhanced as compared to the case of carrying out plasma oxidation processing solely under the conditions of the oxygen content in the processing gas of 0.5 to 10% and the processing pressure of 1.3 to 665 Pa.

BEST MODE FOR CARRYING OUT THE INVENTION

Figure 1:
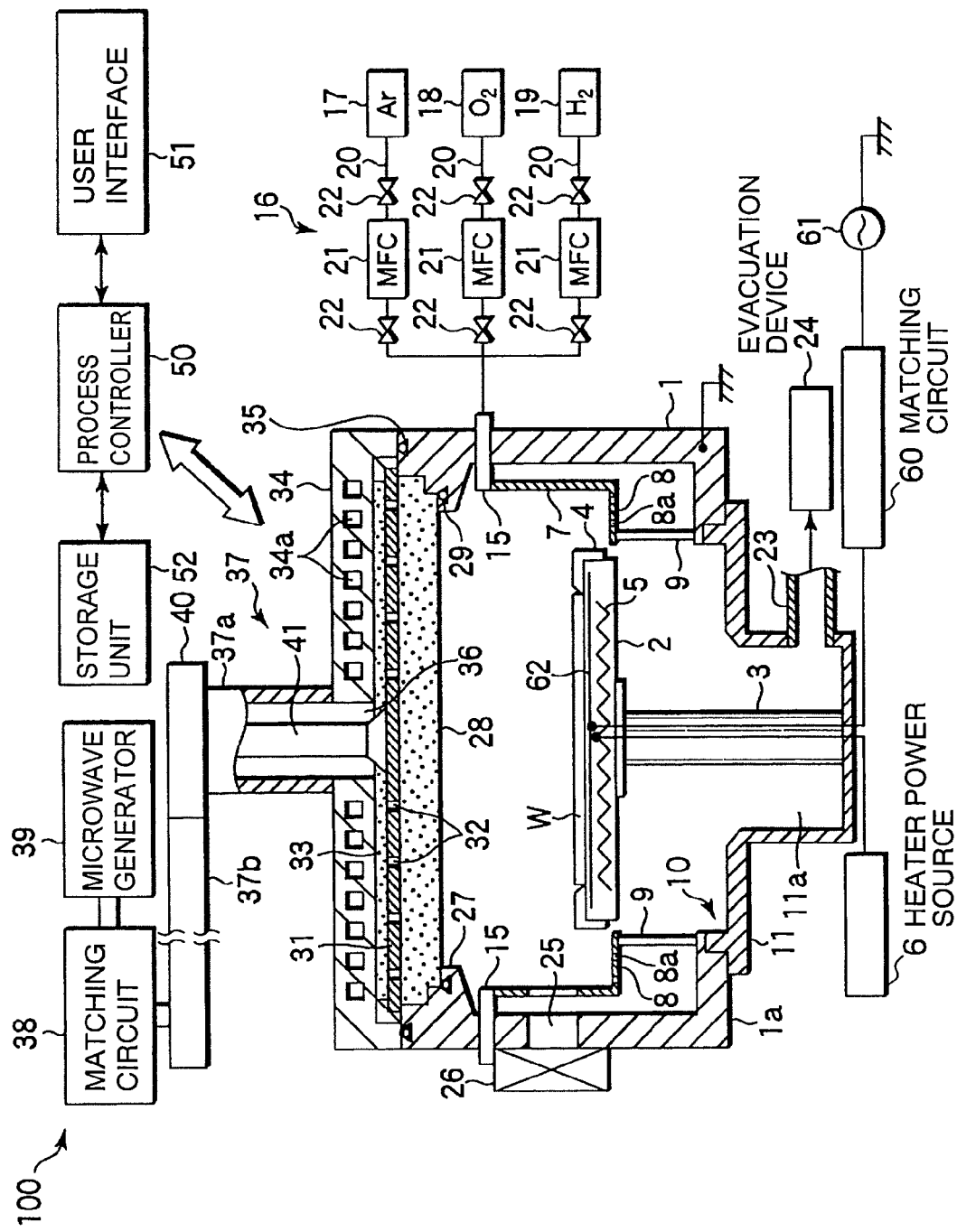
FIG. 1 is a schematic cross-sectional view of an example of a plasma processing apparatus suited for carrying out a method according to the present invention.

Preferred embodiments of the present invention will now be described with reference to the drawings. FIG. 1 is a cross-sectional diagram schematically illustrating an example of a plasma processing apparatus suited for carrying out a silicon oxide film forming-method according to the present invention. The plasma processing apparatus is constructed as an RLSA microwave plasma processing apparatus capable of generating a high-density and low-electron temperature microwave plasma by introducing microwaves into a processing chamber by means of an RLSA (radial line slot antenna), which is a plane antenna having a plurality of slots. The plasma processing apparatus can be advantageously used e.g. for the formation of an insulating film in a variety of semiconductor devices, such as a gate insulating film of a transistor.

The plasma processing apparatus 100 includes a generally-cylindrical airtight and grounded chamber 1. A circular opening 10 is formed generally centrally in the bottom wall 1a of the chamber 1. The bottom wall 1a is provided with a downwardly-projecting exhaust chamber 11 which communicates with the opening 10.

In the chamber 1 is provided a susceptor 2 (mounting table), made of a ceramic such as AlN, for horizontally supporting a semiconductor wafer (hereinafter referred to simply as "wafer") W as a substrate to be processed. The susceptor 2 is supported by a cylindrical support member 3, made of a ceramic such as AlN, extending upwardly from the center of the bottom of the exhaust chamber 11. The susceptor 2, in its peripheral portion, is provided with a guide ring 4 for guiding the wafer W. A resistance heating-type heater 5 is embedded in the susceptor 2. The heater 5, when powered from a heater power source 6, heats the susceptor 2 and, by the heat, heats the wafer W as a processing object. The wafer processing temperature can be controlled e.g. in the range of room temperature to 800° C.

A high-frequency power source 61 for bias is connected via a matching circuit 60 to the susceptor 2. In particular, an electrode 62 is embedded in the susceptor 2, and the high-frequency power source 61 is connected to the electrode 62, so that a high-frequency power can be supplied thereto. The electrode 62 is formed of a conductive material, such as molybdenum or tungsten, has approximately the same area as the wafer W and has e.g. a net-like shape, a grid-like shape or a spiral shape.

A high-frequency power, having a predetermined frequency, preferably 300 kHz to 60 MHz, more preferably 400 kHz to 27 MHz and preferably having a power of 5 to 3600 W, is applied from the high-frequency power source 61 at a high power density per unit area of the wafer, which is preferably 0.05 to 1 W/cm$^2$.

The susceptor 2 is provided with wafer support pins (not shown) for raising and lowering the wafer W while supporting it. The wafer support pins are each projectable and retractable with respect to the surface of the susceptor 2.

A cylindrical liner 7 of quarts is provided on the inner circumference of the chamber 1. Further, an annular quartz baffle plate 8, having a large number of exhaust holes 8a for uniformly evacuating the chamber 1, is provided around the circumference of the susceptor 2. The baffle plate 8 is supported on support posts 9.

An annular gas introduction member 15 is provided in the side wall of the chamber 1, and gas injection holes are formed uniformly in the gas introduction member 15. A gas supply system 16 is connected to the gas introduction member 15. It is also possible to use a gas introduction member having the shape of a shower head. The gas supply system 16 has, for example, an Ar gas supply source 17, an O$_2$ gas supply source 18 and an H$_2$ gas supply source 19. These gases each pass through a respective gas line 20 and reach the gas introduction member 15, and are uniformly introduced from the gas injection holes of the gas introduction member 15 into the chamber 1. The gas lines 20 are each provided with a mass flow controller 21 and on-off valves 22 located upstream and downstream of the controller 21. Instead of Ar gas, another rare gas such as Kr, He, Ne or Xe may be used.

An exhaust pipe 23 is connected to the side wall of the exhaust chamber 11, and to the exhaust pipe 23 is connected an exhaust device 24 including a high-speed vacuum pump. By the actuation of the exhaust device 24, the gas in the chamber 1 is uniformly discharged into the space 11a of the exhaust chamber 11, and discharged through the exhaust pipe 23 to the outside. The chamber 1 can thus be quickly depressurized into a predetermined vacuum level, e.g. 0.133 Pa.

The side wall of the chamber 1 is provided with a transfer port 25 for transferring the wafer W between the plasma processing apparatus 100 and an adjacent transfer chamber (not shown), and a gate valve 26 for opening and closing the transfer port 25.

The chamber 1 has a top opening, and a ring-shaped support 27 is provided along the periphery of the opening. A microwave transmission plate 28, which is made of a dielectric material, e.g. a ceramic such as quartz or Al$_2$O$_3$ and is transmissive to microwaves, is provided on the support 27. The interface between the plate 28 and the support 27 is hermetically sealed with a seal member 29, so that the chamber 1 is kept hermetic.

A disk-shaped plane antenna 31 is provided over the microwave transmission plate 28 such that it faces the susceptor 2.

Figure 2:
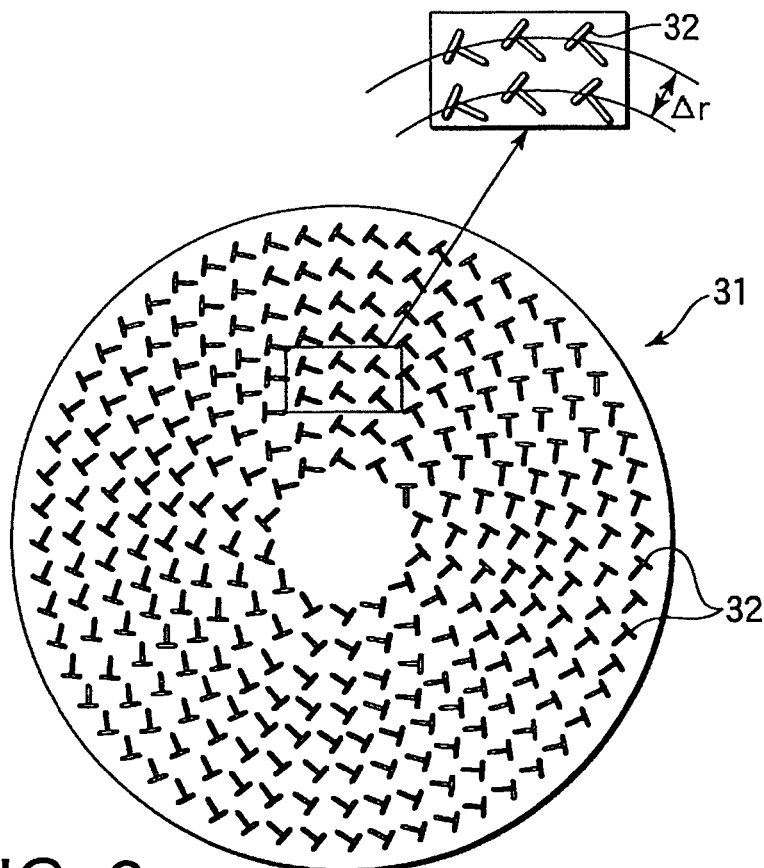
FIG. 2 is a plan view of a plane antenna.

The plane antenna 13 is locked into the upper end of the side wall of the chamber 1. The plane antenna 31 is a circular plate of conductive material and, when the wafer W is of 8 inch size, has a diameter of 300 to 400 mm and a thickness of 0.1 to a few mm (e.g. 1 mm). For example, the plane antenna 31 is comprised of a copper or aluminum plate whose surface is plated with silver or gold, and has a large number of microwave radiating holes (slots) 32 penetrating the plane antenna 31 and formed in a predetermined pattern. The plane antenna 31 may be comprised of a nickel plate or a stainless steel plate. As shown in FIG. 2, each microwave radiating hole 32 is a slot-like hole, and adjacent two microwave radiating holes 32 are paired typically in a letter "T" arrangement. The pairs of microwave radiating holes 32 are arranged in concentric circles as a whole. The length of the microwave radiating holes 32 and the spacing in their arrangement are determined depending on the wavelength ($\lambda$g) of microwaves. For example, the microwave radiating holes 32 are arranged with a spacing of $\lambda$g/4 to $\lambda$g. In FIG. 2, the spacing between adjacent concentric lines of microwave radiating holes 32 is denoted by $\Delta$r. The microwave radiating holes 32 may have other shapes, such as a circular shape and an arch shape. The arrangement of the microwave radiating holes 32 is not limited to the concentric arrangement: the microwave radiating holes 32 may be arranged e.g. in a spiral or radial arrangement.

A retardation member 33 e.g. made of quartz or a resin such as polytetrafluoroethylene or polyimide, having a higher dielectric constant than vacuum, is provided on the upper surface of the plane antenna 31. The retardation member 33 is employed in consideration of the fact that the wavelength of microwaves becomes longer in vacuum. The retardation member 33 functions to shorten the wavelength of microwaves, thereby adjusting plasma. The plane antenna 31 and the microwave transmission plate 28, and the retardation member 33 and the plane antenna 31 may be in contact with or spaced apart from each other.

A cover 34, made of a metal material such as aluminum, stainless steel or copper, is provided on the upper surface of the chamber 1 such that it covers the plane antenna 31 and the retardation member 33. The interface between the upper surface of the chamber 1 and the cover 34 is sealed with a seal member 35. A cooling water flow passage 34a is formed in the interior of the cover 34. The cover 34, the retardation member 33, the plane antenna 31 and the microwave transmission plate 28 can be cooled by passing cooling water through the cooling water flow passage 34a, thereby preventing their deformation or breakage. The cover 34 is grounded.

An opening 36 is formed in the center of the upper wall of the cover 34, and a waveguide 37 is connected to the opening 36. The other end of the waveguide 37 is connected via a matching circuit 38 to a microwave generator 39. Thus, microwaves e.g. having a frequency of 2.45 GHz, generated in the microwave generator 39, are transmitted through the waveguide 37 to the plane antenna 31. Other microwave frequencies such as 8.35 GHz and 1.98 GHz can also be used.

The waveguide 37 is comprised of a coaxial waveguide 37a having a circular cross-section and extending upward from the opening 36 of the cover 34, and a horizontally-extending rectangular waveguide 37b connected via a mode converter 40 to the upper end of the coaxial waveguide 37a. The mode converter 40 between the rectangular waveguide 37b and the coaxial waveguide 37a functions to convert microwaves, propagating in TE mode through the rectangular waveguide 37b, into TEM mode. An inner conductor 41 extends centrally in the coaxial waveguide 37a. The lower end of the inner conductor 41 is connected and secured to the center of the plane antenna 31. A flat waveguide is formed between the cover 34 and the plane antenna 31. With such construction, microwaves are propagated through the inner conductor 41 of the coaxial waveguide 37a to the flat waveguide radially, efficiently and uniformly.

The respective components of the plasma processing apparatus 100 are connected to and controlled by a process controller 50 provided with a microprocessor (computer). To the process controller 50 is connected a user interface 51 which includes a keyboard for a process manager to perform a command input operation, etc. in order to manage the plasma processing apparatus 100, a display which visualizes and displays the operating situation of the plasma processing apparatus 100, etc.

To the process controller 50 is also connected a storage unit 52 in which are stored a control program for executing, under control of the process controller 50, various process steps to be carried out in the plasma processing apparatus 100, and a program or a recipe for causing the respective components of the plasma processing apparatus 100 to execute processing. The recipe is stored in a storage medium in the storage unit 52. The storage medium may be a hard disk or a semiconductor memory, or a portable medium such as CD-ROM, DVD, flash memory, etc. It is also possible to transmit the recipe from another device e.g. via a dedicated line as needed.

A desired processing in the plasma processing apparatus 100 is carried out under the control of the process controller 50 by calling up an arbitrary recipe from the storage unit 52 and causing the process controller 50 to execute the recipe, e.g. through the operation of the user interface 51 performed as necessary.

The plasma processing apparatus 100 thus constructed can perform plasma processing of a wafer W without causing damage thereto and can form a good-quality film even at a low processing temperature of not more than 800° C., preferably not more than 500° C., and in addition, because of its excellent plasma uniformity, can attain process uniformity.

The plasma processing apparatus 100 is suited for forming an oxide film in trenches in shallow trench isolation (STI) which is employed as a device isolation technique in a semiconductor device manufacturing process.

A description will now be made of trench (recess) oxidation processing by means of the plasma processing apparatus 100. First, the gate valve 26 is opened, and a wafer W having trenches (recesses) is carried in from the transfer port 25 into the chamber 1 and placed on the susceptor 2.

Ar gas and $O_2$ gas are supplied from the Ar gas supply source 17 and the $O_2$ gas supply source 18 of the gas supply system 16 and introduced through the gas introduction member 15 into the chamber 1 respectively at a predetermined flow rate; and a predetermined processing pressure is maintained. The content of oxygen in the processing gas (flow rate ratio, i.e. volume ratio) is preferably not less than 0.5% and less than 10%, more preferably 0.5 to 5%, most preferably 0.5 to 2.5%. The flow rate of Ar gas may be selected from the range of 0 to 5000 mL/min and the flow rate of $O_2$ gas may be selected from the range of 1 to 500 mL/min such that the proportion of $O_2$ gas in the total amount of the processing gas satisfies the above value.

In addition to Ar gas and $O_2$ gas from the Ar gas supply source 17 and the $O_2$ gas supply source 18, a predetermined amount of $H_2$ gas may also be supplied from the $H_2$ gas supply source 19. The supply of $H_2$ gas can increase the oxidation rate in plasma oxidation processing. This is because OH radicals are generated by the supply of $H_2$ gas, and the OH radicals contribute to increasing the oxidation rate. In this case, the amount of $H_2$ is preferably 0.1 to 10% of the total amount of the processing gas, more preferably 0.1 to 5%, and most preferably 0.1 to 2%. The flow rate of $H_2$ gas is preferably 1 to 650 mL/min (sccm).

The processing pressure in the chamber is preferably 1.3 to 665 Pa, more preferably 1.3 to 266.6 Pa, most preferably 1.3 to 133.3 Pa. The processing temperature may be in the range of 200 to 800° C., preferably in the range of 400 to 600° C.

Next, microwaves from the microwave generator 39 are introduced via the matching circuit 38 into the waveguide 37. The microwaves pass through the rectangular waveguide 37b, the mode converter 40 and the coaxial waveguide 37a, and are supplied to the plane antenna 31. The microwaves propagate in TE mode in the rectangular waveguide 37b, the TE mode of the microwaves are converted into TEM mode by the mode converter 40 and the TEM mode microwaves are propagated in the coaxial waveguide 37a toward the plane antenna 31. The microwaves are then radiated from the plane antenna 31 through the microwave transmission plate 28 into the space above the wafer W in the chamber 1. The power of the microwave generator 39 is preferably 0.5 to 5 kW (0.25 to 2.5 $W/cm^2$).

During plasma oxidation processing, a high-frequency bias (high-frequency power) of a predetermined frequency and a predetermined power is supplied to the susceptor 2 from the high-frequency power source 61. The high-frequency bias is supplied from the high-frequency power source 61 in order to suppress charge-up damage and eliminate a difference in the thickness of an oxide film due to a density difference in a pattern while maintaining a low electron temperature of plasma (not more than 1.2 eV in the vicinity of the wafer W).

From such a viewpoint, the frequency of the applied high-frequency power may be, for example, 300 kHz to 60 MHz, preferably 400 kHz to 27 MHz. The power density per unit area of the wafer is preferably 0.015 to 5 $W/cm^2$, more preferably 0.05 to 1 $W/cm^2$. The power density is desirably not less than 0.1 $W/cm^2$. The power output of the high-frequency power is preferably 5 to 3600 W, more preferably 10 to 1000 W.

By the microwaves radiated from the plane antenna 31 into the chamber 1 via the microwave transmission plate 28, an electromagnetic field is formed in the chamber 1, and the Ar gas, $O_2$ gas, etc. turn into a plasma. The plasma oxidizes the silicon surface exposed in recessed portions formed in the wafer W. Because the microwaves are radiated from the large number of microwave radiating holes 32 of the plane antenna 31, the microwave plasma has a high density of about $1 \times 10^{10}$ to $5 \times 10^{12}/cm^3$ or even more, an electron temperature of about 0.5 to 2 eV and a plasma density uniformity of not more than ±5%. The plasma processing apparatus 100 has the advantage that a low electron temperature of plasma, such as not more than 1.2 eV in the vicinity of the wafer W, can be maintained even when a bias voltage is applied to the wafer W by supplying a high-frequency power to the susceptor 2 from the high-frequency power source 61.

This will be explained based on data.

Figure 3:
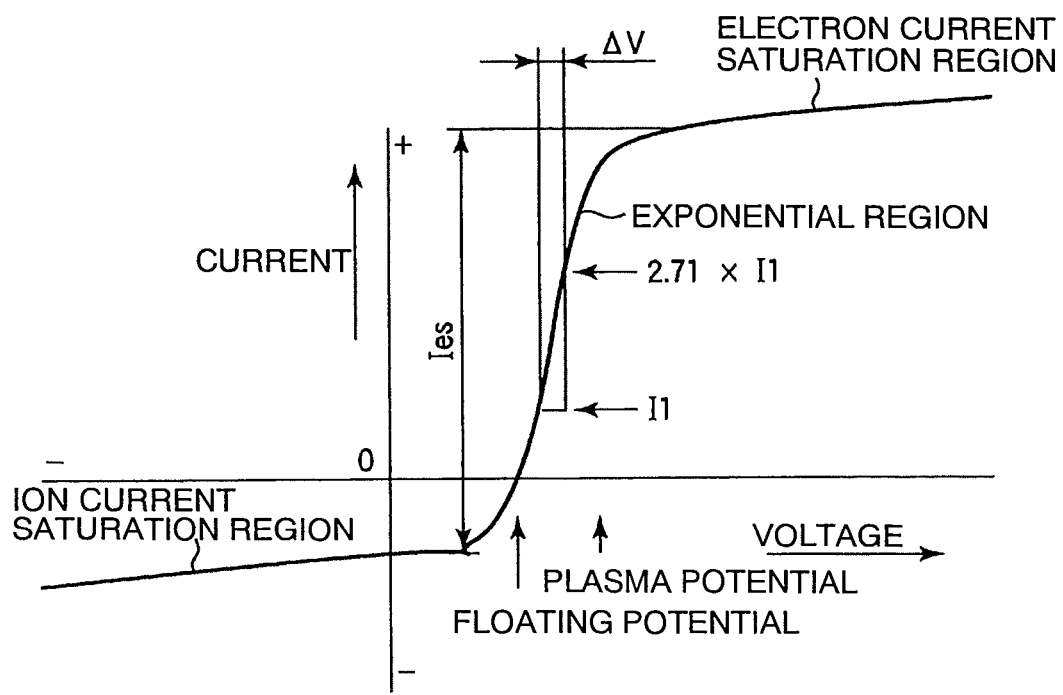
FIG. 3 is a diagram showing a common current-voltage characteristic as observed when a Langmuir probe is inserted into a plasma and the applied voltage is swept.

The electron temperature of a plasma can be determined from the voltage-current characteristic shown in FIG. 3, observed when a Langmuir probe is inserted into the plasma and the applied voltage is swept. In particular, when a current value I1 is taken at an arbitrary position in the exponential region of FIG. 3, the electron temperature (Te) is determined as a voltage change ΔV which corresponds to e-fold (about 2.7-fold) increase in current from I1. Thus, the electron temperature is constant in the exponential region if the slope of the region is constant.

Figure 4:
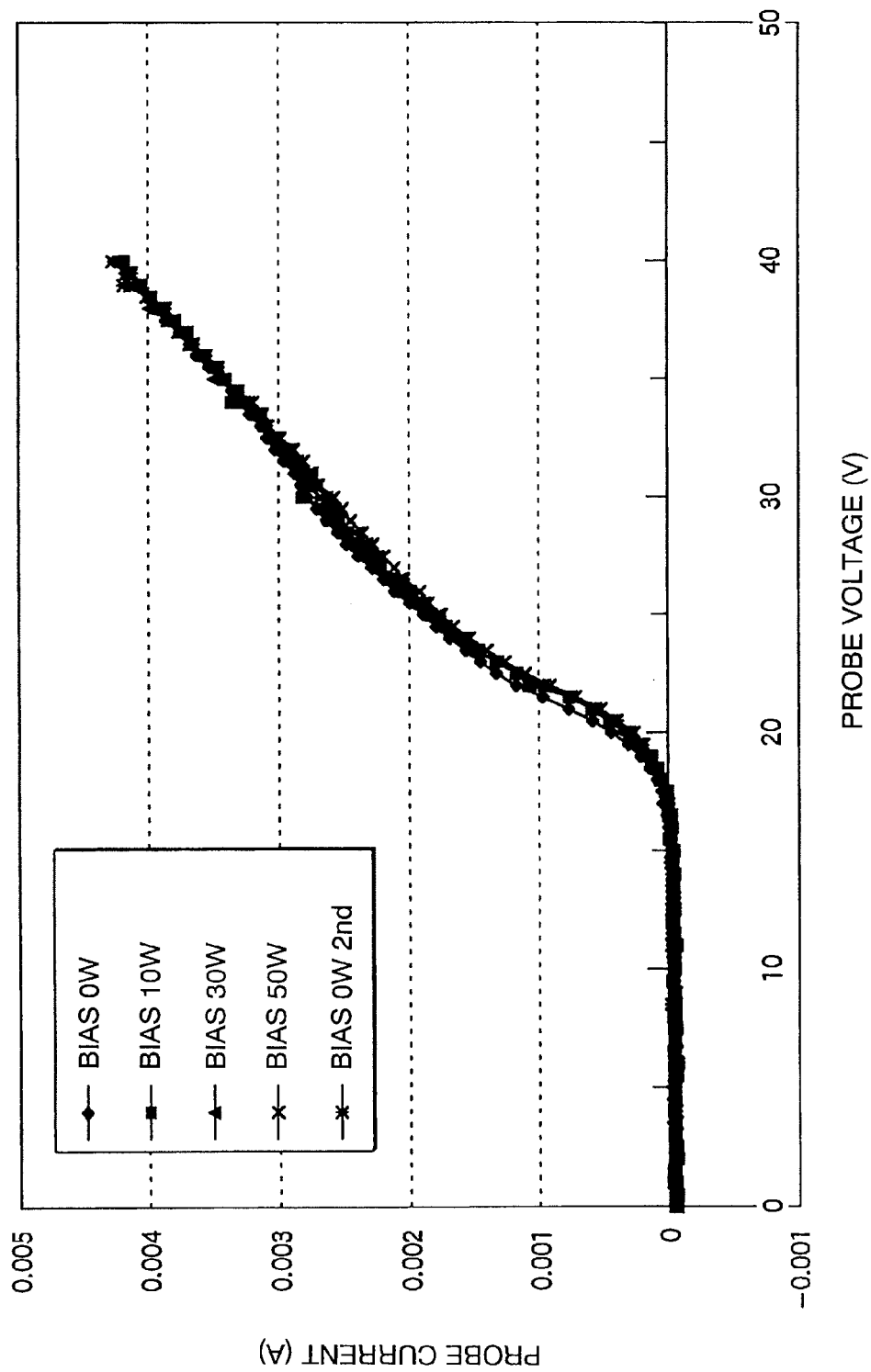
FIG. 4 is a diagram showing current-voltage characteristics as observed when a bias power is varied.
Figure 5:
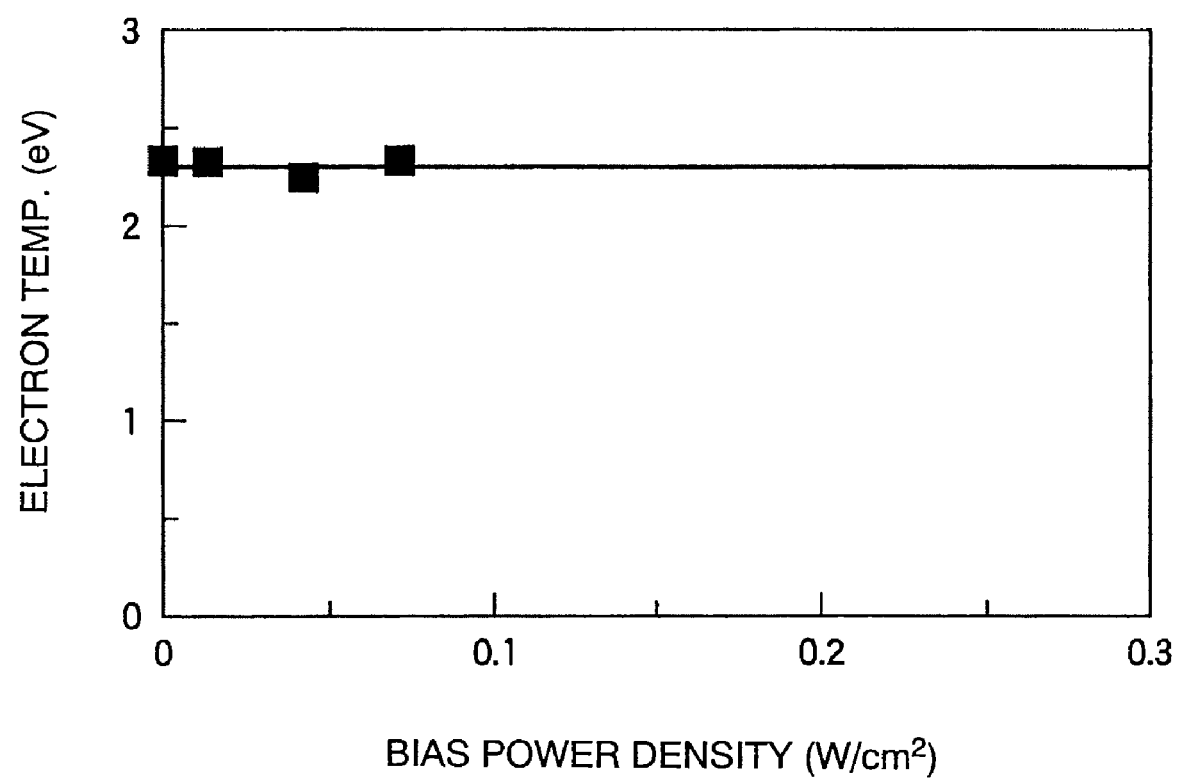
FIG. 5 is a diagram showing the relationship between bias power density and plasma electron temperature.

In the plasma processing apparatus of FIG. 1, plasma was generated with varying high-frequency biases applied to the susceptor, and the voltage-current characteristics were measured with a Langmuir probe. In this test, a 200-mm wafer was used, Ar gas was supplied at a flow rate of 250 mL/min (sccm), and plasma was generated under the conditions of: a pressure of 7.3 Pa, a microwave power of 1000 W and varying bias powers of 0 W, 10 W, 30 W and 50 W. The area of the electrode provided in the susceptor is 706.5 cm$^2$. The results are shown in FIG. 4. As shown in the Figure, the slope of the exponential region is approximately constant irrespective of bias power. Accordingly, as shown in FIG. 5, the electron temperature is also approximately constant without depending on bias power (indicated in terms of bias power density in FIG. 5). Thus, the low-electron temperature characteristic of plasma can be maintained even when a high-frequency bias is applied to the wafer W at a power density of 0.015 to 1 W/cm$^2$.

Therefore, even when a high-frequency bias is applied to a wafer W as in this embodiment, oxidation processing can be carried out at a low temperature in a short time, enabling the formation of a thin uniform oxide film. Furthermore, a good-quality silicon oxide film can be formed substantially without damage to the film e.g. due to ions in plasma.

Furthermore, a round shape can be introduced into upper corners of silicon having a three-dimensional pattern, such as trenches, by carrying out plasma oxidation processing under the conditions of: a processing pressure of 1.3 to 665 Pa, preferably 1.3 to 266.6 Pa, more preferably 1.3 to 133.3 Pa; and the content of oxygen in a processing gas of not less than 0.5% and less than 10%, preferably 0.5 to 5%, more preferably 0.5 to 2.5%. However, the use of such conditions alone will produce a variation in the thickness of the resulting film due to a density difference in the pattern.

The fact that a silicon substrate can take a better round shape at upper corner portions by carrying out plasma oxidation processing under the "low-pressure, low-oxygen concentration conditions" of a relative low pressure of 1.3 to 665 Pa and an oxygen content of not less than 0.5% and less than 10%, is considered to be due to electric field concentration in the corner portions. That is, ions concentrate in the corners, causing progress of selective oxidation of the corner portions.

With the "low-pressure, low-oxygen concentration conditions", however, due to the micro-loading effect, a difference in the thickness of an oxide film will be produced by a density difference in the pattern.

On the other hand, by applying a high-frequency bias (high-frequency power) from the high-frequency power source 61 to the wafer W as described above, a silicon oxide film with a uniform thickness can be formed without being influenced by a density difference in the pattern formed in the surface of the processing object.

The elimination of the influence of a density difference in the pattern by the application of a high-frequency bias to the wafer W is because of promoted drawing of ions into dense areas of the pattern.

As described above, the application of a high-frequency bias to the wafer W enables more effective introduction of a round shape into upper corner portions and, in addition, can enhance the selectivity of the thickness of a silicon oxide film on the bottoms of the pattern over the film thickness on the side walls of the pattern, thereby making the oxide film formed on the side walls thinner.

Further, by applying an appropriate high-frequency bias to the susceptor 2 while appropriately controlling the processing pressure and the oxygen content of a processing gas, simultaneous achievement of the reduction of the influence of a pattern density difference and the formation of roundness in upper corner portions of the pattern, which has ever been impossible, becomes possible.

The promotion of roundness formation in upper corner portions of the pattern by the application of a high-frequency bias to the wafer W is considered to be due to the fact that the oxidation becomes more isotropic by electric field concentration. The enhanced selectivity of the thickness of a silicon oxide film on the bottoms of the pattern is considered to be due to the ion-assisted radical oxidation effect.

As with the difference in the thickness of an oxide film due to a density difference in the pattern, the degree of roundness of the silicon oxide film in the upper corner portions of the pattern and the selectivity of the thickness of the silicon oxide film can also be controlled by the power of the high-frequency bias. The power of the high-frequency bias may be appropriately set so that the difference in the thickness of the oxide film, the degree of roundness of the corner portions and the thickness of the oxide film on the side walls of the pattern will be well balanced.

Figure 6:
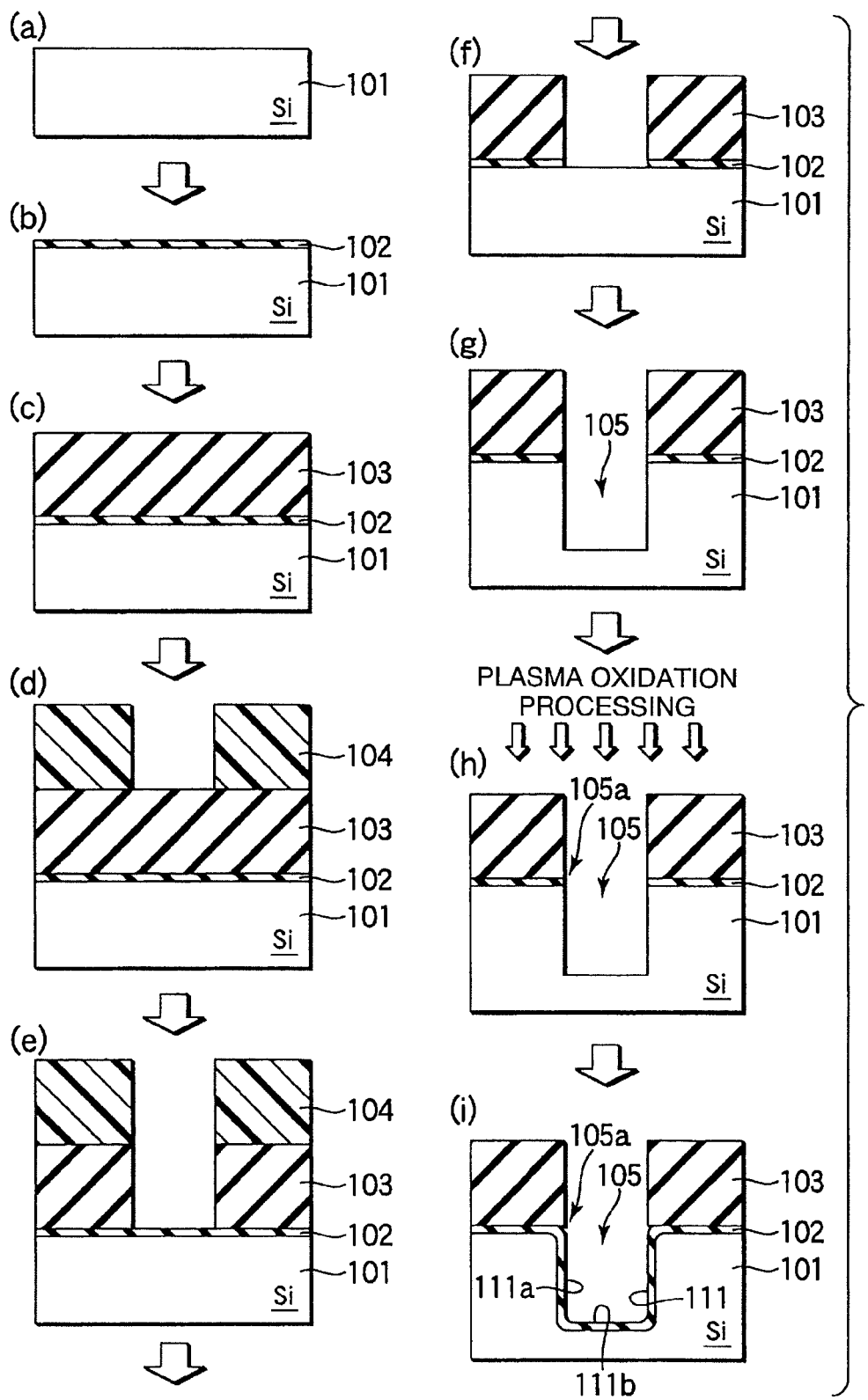
FIG. 6 shows schematic cross-sectional diagrams of a wafer, illustrating application of the method of the present invention in device isolation by STI.

The formation of a silicon oxide film, carried out by the silicon oxide film-forming method of the present invention, in trenches in an STI process will now be described with reference to FIG. 6. FIG. 6 illustrates process steps for the formation of trenches and the subsequent formation of an oxide film in STI.

Referring to (a) and (b) of FIG. 6, a silicon oxide film 102 such as $SiO_2$ is first formed e.g. by thermal oxidation on a silicon substrate 101. Next, as shown in (c), a silicon nitride film 103 such as $Si_3N_4$ is formed on the silicon oxide film 102 e.g. by CVD (chemical vapor deposition). Thereafter, as shown in (d), after coating a photoresist onto the silicon oxide film 103, patterning is carried out by the photolithography technique to form a resist layer 104.

Next, as shown in (e), selective etching of the silicon nitride film 103 and the silicon oxide film 102 is carried out with the resist layer 104 as an etching mask, using e.g. a halogen etching gas, thereby exposing the silicon substrate 101 in accordance with the pattern of the resist layer 104. Thus, a mask pattern for trenches is formed by the silicon nitride film 103. FIG. 6 (f) illustrates the step of removing the resist layer 104 by so-called ashing as carried out by using an oxygen-containing plasma of a processing gas containing oxygen, etc.

Next, as shown in (g), trenches 105 are formed by carrying out selective etching of the silicon substrate 101 with the silicon nitride film 103 and the silicon oxide film 102 as a mask. The etching can be carried out by using an etching gas e.g. containing a halogen or a halogen compound, such as $Cl_2$, HBr, $SF_6$ or $CF_4$, etc, or $O_2$.

FIG. 6(h) illustrates the step of forming a silicon oxide film in the trenches 105 of the wafer W after etching in the STI process. In this step, plasma oxidation processing is carried out under the above-described conditions of: the content of oxygen in a processing gas of not less than 0.5% and less than 10%; and a processing pressure of 1.3 to 665 Pa, while supplying a high-frequency power, having the above-described ranges of frequency and output power, to the susceptor 2. As described above, by carrying out plasma oxidation processing under such conditions, the selectivity of the thickness of the oxide film on the bottoms of the trenches over the thickness of the film on the side walls of the trenches can be enhanced, thus making the oxide film formed on the side walls thinner as shown in (i). Furthermore, the silicon 101 in the shoulder portions 105a of the trenches 105 can be rounded off and, in addition, even when there is a density difference in a line/space pattern of the trenches 105, a difference in the thickness of the silicon oxide film between the film formed on a non-dense area and the film formed a dense area can be reduced. Thus, the formation of a uniform silicon oxide film becomes possible.

To enhance the selectivity of the thickness of an oxide film on the bottoms of trenches suits the progress toward finer devices. As devices become finer, the thickness of an oxide film becomes significant for ensuring a transistor area; it will become difficult with the use of a thick oxide film to ensure a transistor area. According to the present invention, an oxide film formed on the side walls of trenches can be made thinner by enhancing the selectivity of the formation of the oxide film on the bottoms of the trenches, making it possible to ensure a transistor area. On the other hand, an oxide film on the bottoms of trenches needs a conventional level of thickness in order to mend damage caused in a device isolation process. The necessary thickness of the bottom oxide film can be secured by enhancing the selectivity of the thickness of the film on the bottoms of trenches according to the present invention.

Further, by introducing a round shape into the silicon 101 in the shoulder portions 105a of the trenches 105, the occurrence of leakage current can be reduced as compared to the case where those portions are formed in an acute shape.

After forming the silicon oxide film 111 by the silicon oxide film-forming method of the present invention, the subsequent steps are carried out in accordance with the usual procedure of STI for device isolation region formation: An insulating film of e.g. $SiO_2$ is filled into the trenches 105 e.g. by CVD, followed by polishing by CMP (chemical mechanical polishing) with the silicon nitride film 103 as a stopper layer to flatten the surface. Thereafter, the silicon nitride film 103 and the upper portion of the embedded insulating film are removed by etching or CMP, thereby forming a device isolation structure.

A description will now be given of an experiment conducted to confirm the technical effects of the present invention.

Figure 7:
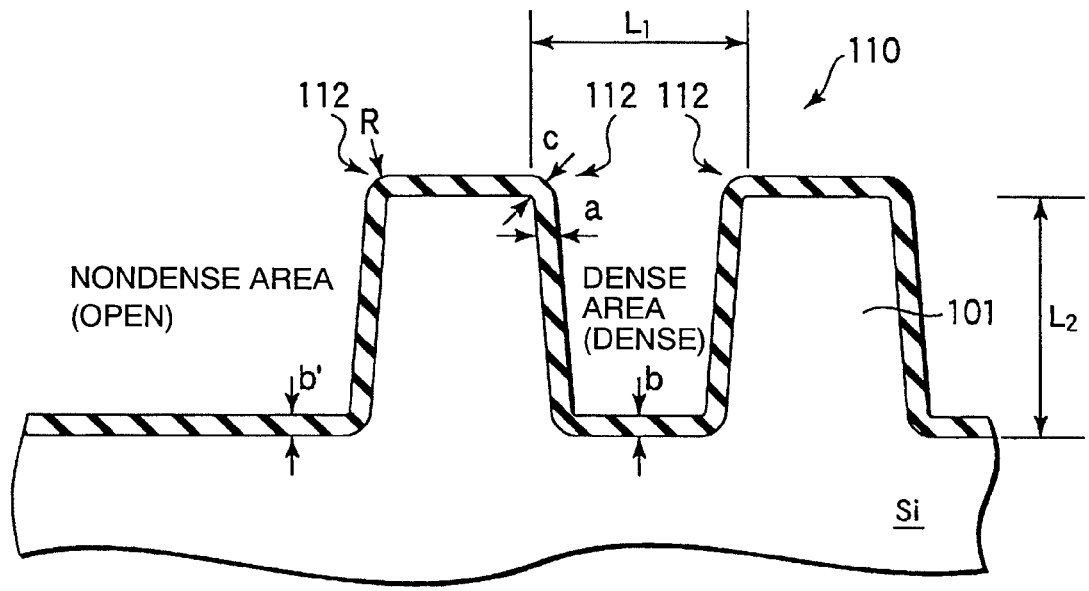
FIG. 7 is a schematic vertical sectional diagram showing a patterned wafer surface.

The silicon oxide film-forming method of the present invention was applied in the formation of an oxide film on a silicon surface in which a line/space pattern having a density difference as shown in FIG. 7 is formed. FIG. 7 schematically shows the cross-sectional structure of the main portion of a wafer W after the formation of a silicon oxide film 111 on the surface of a silicon substrate 101 having a pattern 110.

In this experiment, using the plasma processing apparatus 100 of FIG. 1, plasma oxidation processing was carried out under the below-described conditions A to C to form a silicon oxide film. After the processing of each wafer sample, an SEM photograph of the sample was shot. From the shot image were measured the side wall film thickness "a" and the bottom film thickness "b" in a dense area (dense) of the pattern 110, and the bottom film thickness "b'" and the corner film thickness "c" in a non-dense or open area (open). Further, from the measured values were determined the bottom/side wall film thickness ratio (b/a), the dense/open bottom film thickness ratio (dense/non-dense bottom film thickness ratio) (b/b') and increase in corner film thickness over 0 W bias (ratio of the corner film thickness c with application of a bias to the corner film thickness c without application of a bias). The roundness radius R of the corner portion (shoulder portion) 112 was also measured. The results are shown in Table 1 and FIGS. 8 through 10. The opening width $L_1$ of a recessed portion in the dense area was 200 nm, and the depth $L_2$ of the recessed portion was 450 nm.

The bottom/side wall film thickness ratio is an index of the selectivity of the thickness of the oxide film on the bottom over the thickness of the oxide film on the side wall, and a higher ratio is better. As described above, from the viewpoint of addressing the progress toward finer devices, the side wall film thickness is preferably as small as possible; it is preferably not more than 10 nm, more preferably not more than 5 nm. The dense/open bottom film thickness ratio is an index of the difference in the thickness of the oxide film between the dense area and the non-dense area of the pattern 110; it is preferably not less than 0.8, more preferably not less than 0.9, most preferably not less than 0.95. The increase in corner film thickness over 0 W bias is an index of the corner rounding off effect, and is preferably not less than 1.2. The roundness radius R of the corner portion (shoulder portion) 112 can be measured as the curvature radius of the corner portion, and a larger value is better.

<Common Conditions>
Ar flow rate: 2000 mL/min (sccm)
$O_2$ gas flow rate: 30 mL/min (sccm)
$O_2$ gas content: 1.5%
Processing pressure: 127 Pa (0.95 Torr)
Microwave power: 1.87 W/cm$^2$
Processing temperature: 500° C.
Thickness of film: 6 nm
Wafer diameter: 200 mm
<Conditions A>—Comparative Conditions
High-frequency bias: none
Processing time: 335 sec
<Conditions B>—Conditions According to the Invention
High-frequency bias
Frequency: 400 kHz
Power: 50 W (power density 0.159 W/cm$^2$)
Processing time: 130 sec
<Conditions C>—Conditions According to the Invention
High-frequency bias
Frequency: 400 kHz
Power: 200 W (power density 0.637 W/cm$^2$)
Processing time: 36 sec

TABLE 1

| Conditions | Bias power density (W/cm$^2$) | C (nm) | b/b' | b/a | Increase Ratio in c | Roundness radius R |
|---|---|---|---|---|---|---|
| A | 0 | 1.6 | 0.767 | 1.09 | 1 | 1.6 cm |
| B | 0.159 | 2.5 | 1.045 | 2.09 | 1.56 | 2.5 cm |
| C | 0.637 | 2.7 | 1.030 | 2.43 | 1.68 | 2.7 cm |

Figure 8:
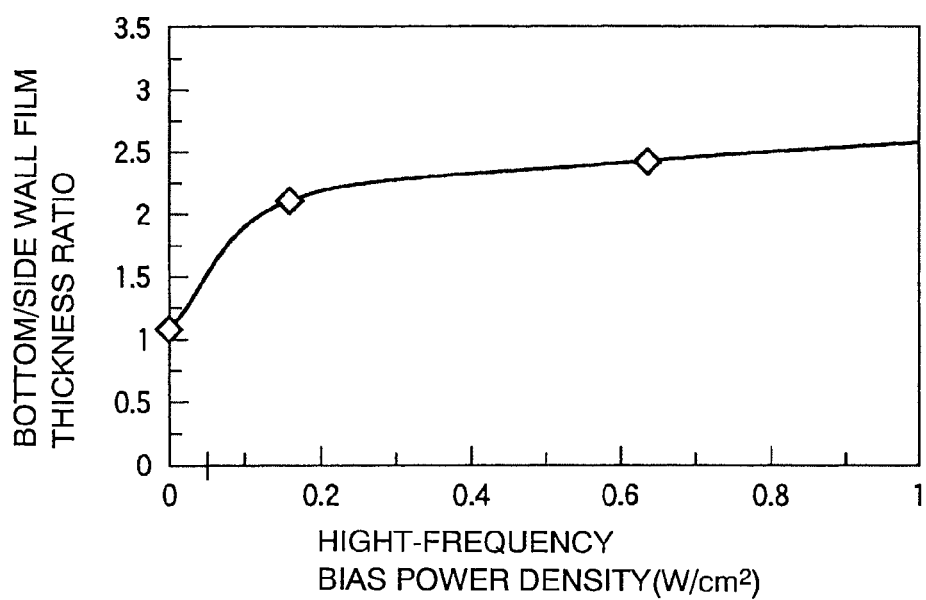
FIG. 8 is a diagram showing the relationship between high-frequency bias power density and bottom/side wall film thickness ratio.

As shown in Table 1 and FIG. 8, with reference to the bottom/side wall film thickness ratio which is an index of the selectivity of the thickness of the oxide film on the bottom over the thickness of the oxide film on the side wall, the ratio is 1.09 in the case of the comparative conditions A without applying bias power, whereas the ratios are 2.09 and 2.43 in the cases of the conditions B and C, respectively, and the ratio thus increases with the increase in the bias power applied. The data thus indicates that the processing conditions according to the present invention, which involves application of a high-frequency bias, can make the oxide film on the side wall thinner, and that the effect is higher as a high bias power is applied. The thicknesses of the oxide films, formed on the side walls under the conditions B and C, were both not more than 5 nm.

Figure 9:
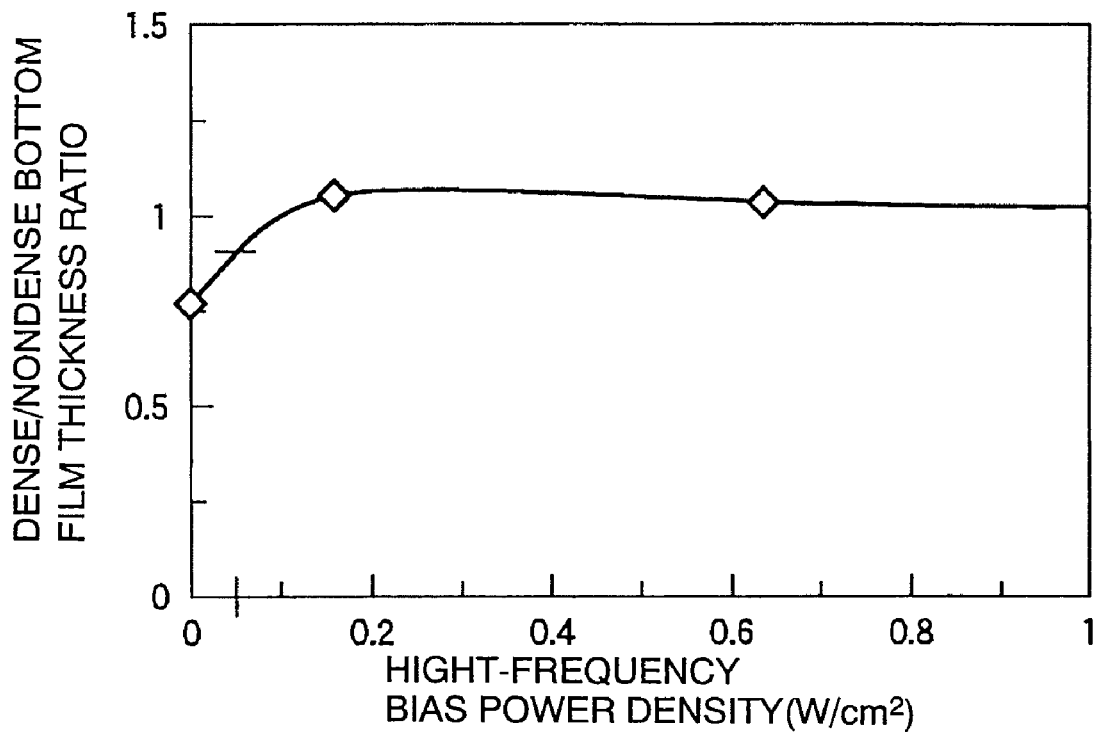
FIG. 9 is a diagram showing the relationship between high-frequency bias power density and dense/non-dense bottom film thickness ratio.

As shown in Table 1 and FIG. 9, with reference to the dense/open bottom film thickness ratio which is an index of the difference in the thickness of the oxide film between the dense area and the non-dense area of the pattern 110, the ratios are 1.045 and 1.030 respectively for the silicon oxide films formed under the conditions B and C according to the present invention, which ratios are considerably larger than the ratio 0.767 for the silicon oxide film formed under the comparative conditions A not involving application of a high-frequency bias. The data thus indicates significant reduction, or improvement, in the film thickness difference between the dense area and the non-dense area by the high-frequency bias application according to the present invention.

Figure 10:
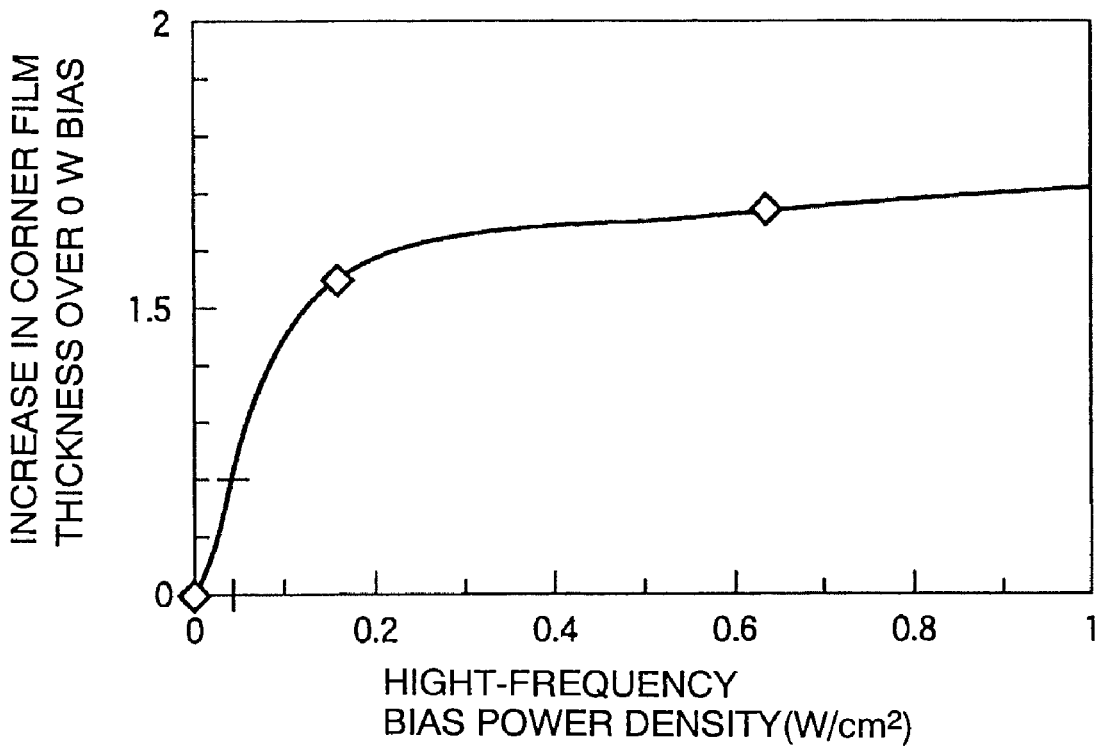
FIG. 10 is a diagram showing the relationship between high-frequency bias power density and increase in corner film thickness over 0 W bias.

As shown in Table 1 and FIG. 10, the corner film thicknesses obtained under the conditions B and C according to the present invention show significant increases of 1.56 and 1.68, respectively (the values show the ratio of the corner film thickness c with application of a bias to the corner film thickness c̄ without application of a bias). With reference to the roundness radius R of the corner portion, i.e. the curvature radius of the corner portion, as shown in Table 1, while the value is 1.6 cm in the case of the comparative conditions A without application of a bias, the values are 2.5 cm and 2.7 cm in the cases of the conditions B and C with application of a bias according to the present invention, indicating improvement in the round shape of the corner portion. This is considered to be due to the fact that the oxidation becomes more isotropic by the bias application. The following are experimental results which confirm this fact.

Figure 11:
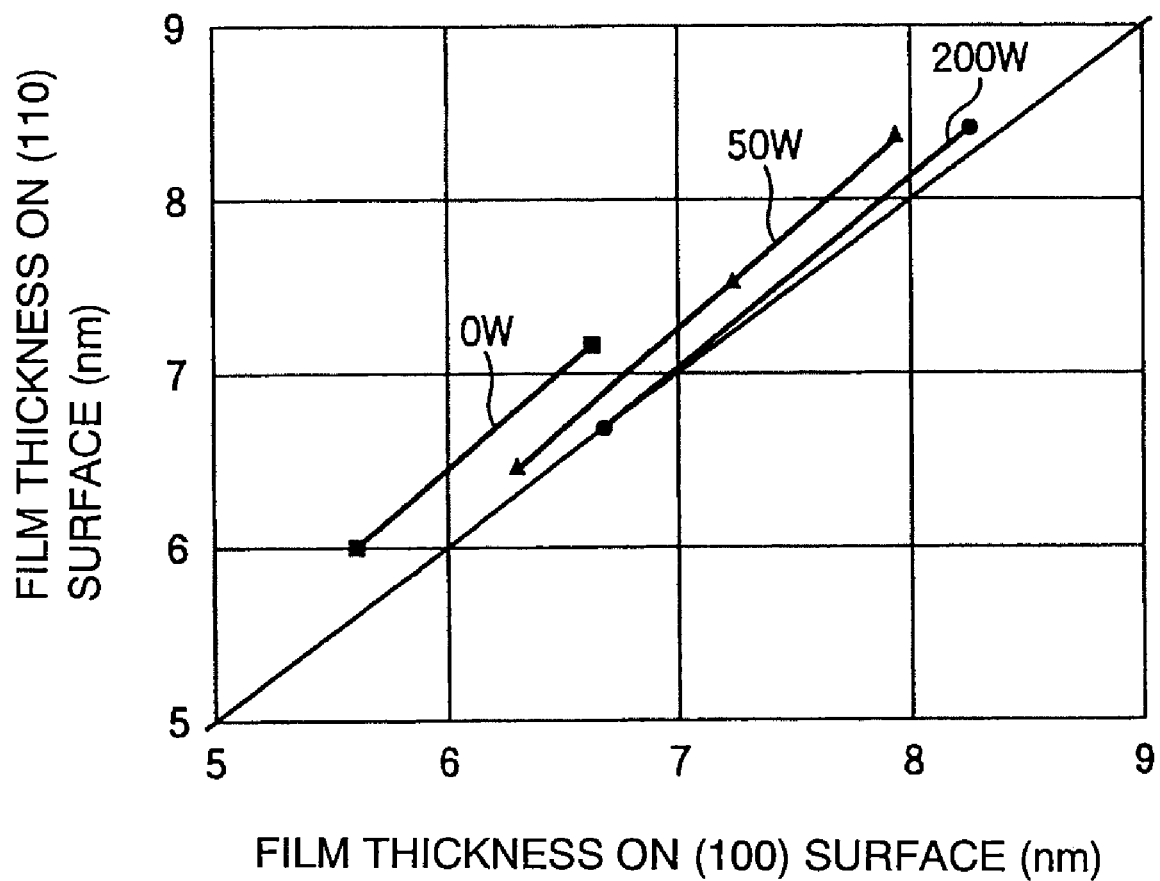
FIG. 11 is a diagram showing the relationship between the thickness of a silicon oxide film formed on a silicon (100) surface and the thickness of the silicon oxide film formed on a silicon (110) surface as observed when a high-frequency bias is varied.

The thicknesses of silicon oxide films formed under the above-described conditions A to C on a silicon (100) surface and on a silicon (110) surface were measured. FIG. 11 shows the relationship between the thickness of each oxide film on the (100) surface, represented on the abscissa, and the thickness of the oxide film on the (110) surface, represented on the ordinate. As can be seen from the data in FIG. 11, the plane orientation dependency of the formation of a silicon oxide film decreases, i.e. the film formation becomes more isotropic, with the increase in the power of the high-frequency bias.

The present invention is not limited to the embodiments described above, but various modifications may be made thereto. For example, though in the embodiments the RLSA-type plasma processing apparatus is used as an apparatus for carrying out the method of the present invention, it is also possible to use other types of plasma processing apparatuses, such as remote plasma type, ICP plasma type, ECR plasma type, surface reflected wave plasma type, magnetron plasma type, etc.

Though the aforementioned embodiment illustrates formation of an oxide film in trenches in STI, which requires formation of a high-quality oxide film on the surface, having a patterned irregularity, of a silicon substrate which is a monocrystalline silicon, the present invention finds other applications for which the formation of a high-quality oxide film on the surface having a patterned irregularity is needed, for example, in the formation of an oxide film on a polysilicon gate electrode-side wall of a transistor. The present invention is also applicable in the formation of a silicon oxide film as an insulating film on a silicon surface having a patterned irregularity in which there is a plane orientation difference, for example in the process of manufacturing a three-dimensional transistor e.g. having a fin structure or a trench gate structure.

Further, while the formation of an oxide film in trenches in STI has been described, the present invention is applicable in the formation of a variety of silicon oxide films, for example, the formation of a side oxide film and a gate oxide film of a polysilicon gate electrode after etching.

The invention claimed is:

1. A plasma oxidation processing method for forming a silicon oxide film by subjecting a processing object having a three-dimensional pattern to oxidation processing with a plasma, said method comprising:
    setting a processing object having a patterned irregularity on a mounting table provided in a processing chamber of a plasma processing apparatus;
    supplying a processing gas, containing oxygen in an amount of not less than 0.5% and less than 10%, into the processing chamber and keeping the pressure in the chamber at 1.3 to 665 Pa; and
    forming a plasma of the processing gas while applying a high-frequency power to the mounting table and thereby applying a high-frequency bias to the process object, thereby carrying out oxidation processing of the processing object with the plasma,
    wherein an output of the high-frequency power is 5 to 3600 W,
    wherein the frequency of the high-frequency power is 300 kHz to 60 MHz, and
    wherein processing temperature in the processing chamber is 200 to 800° C.

2. The plasma oxidation processing method according to claim 1, wherein the oxygen content in the processing gas is 0.5 to 5%.

3. The plasma oxidation processing method according to claim 2, wherein the oxygen content in the processing gas is 0.5 to 2.5%.

4. The plasma oxidation processing method according to claim 1, wherein the processing pressure in the processing chamber is 1.3 to 266.6 Pa.

5. The plasma oxidation processing method according to claim 4, wherein the processing pressure in the processing chamber is 1.3 to 133.3 Pa.

6. The plasma oxidation processing method according to claim 1, wherein the output of the high-frequency power per unit area of the processing object is 0.015 to 5 W/cm2.

7. The plasma oxidation processing method according to claim 6, wherein the output of the high-frequency power per unit area of the processing object is 0.05 to 1 W/cm2.

8. The plasma oxidation processing method according to claim 1, wherein the frequency of the high-frequency power is 400 kHz to 27 MHz.

9. The plasma oxidation processing method according to claim 1, wherein the processing gas contains hydrogen in an amount of 0.1 to 10%.

10. The plasma oxidation processing method according to claim 1, wherein the patterned irregularity is formed at least in a silicon portion of the processing object.

11. The plasma oxidation processing method according to claim 10, wherein the patterned irregularity is formed in a silicon portion and an insulating film portion of the processing object, and at least the recessed portions of the patterned irregularity are formed in the silicon portion.

12. The plasma oxidation processing method according to claim 1, wherein the plasma of the processing is a microwave-excited plasma formed by means of microwaves introduced into the processing chamber from a plane antenna having a plurality of slots.

13. The plasma oxidation processing method according to claim 1, wherein the output of the high-frequency power is 10 to 1000 W.

* * * * *